United States Patent
Romanescu (10) Patent No.: US 9,478,671 B2
(45) Date of Patent: Oct. 25, 2016

(54) SEMICONDUCTOR DEVICE INCLUDING A RESISTOR AND METHOD FOR THE FORMATION THEREOF

(71) Applicant: GLOBALFOUNDRIES Inc., Grand Cayman (KY)

(72) Inventor: Alexandru Romanescu, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/602,940

(22) Filed: Jan. 22, 2015

(65) Prior Publication Data

US 2015/0137316 A1 May 21, 2015

Related U.S. Application Data

(62) Division of application No. 14/173,995, filed on Feb. 6, 2014, now Pat. No. 9,012,313.

(60) Provisional application No. 61/792,348, filed on Mar. 15, 2013.

(51) Int. Cl.
| | |
|---|---|
| *H01L 29/8605* | (2006.01) |
| *H01L 49/02* | (2006.01) |
| *H01L 27/06* | (2006.01) |

(52) U.S. Cl.
CPC ....... *H01L 29/8605* (2013.01); *H01L 27/0629* (2013.01); *H01L 28/20* (2013.01); *H01L 28/24* (2013.01); *Y10S 438/914* (2013.01)

(58) Field of Classification Search
CPC ............... H01L 29/8605; H01L 28/20; H01L 27/0629; H01L 28/24; Y10S 438/914
See application file for complete search history.

(56) References Cited

U.S. PATENT DOCUMENTS

| | | | |
|---|---|---|---|
| 5,972,783 A | 10/1999 | Arai et al. | |
| 6,140,910 A | 10/2000 | Smith et al. | |
| 2003/0025162 A1* | 2/2003 | Oda | H01L 28/20 257/349 |
| 2004/0065925 A1* | 4/2004 | Bhattacharyya | H01L 21/84 257/359 |
| 2004/0235281 A1 | 11/2004 | Downey et al. | |
| 2008/0295882 A1* | 12/2008 | Stephens | H01L 31/0236 136/244 |
| 2009/0201715 A1 | 8/2009 | Kreupl | |
| 2011/0269302 A1 | 11/2011 | Bhaskaran et al. | |
| 2013/0020680 A1 | 1/2013 | Chen et al. | |
| 2013/0112252 A1* | 5/2013 | Seo | H01L 31/02167 136/255 |
| 2014/0001547 A1 | 1/2014 | Schulze et al. | |
| 2014/0261648 A1 | 9/2014 | Smith et al. | |

\* cited by examiner

*Primary Examiner* — Michelle Mandala
(74) *Attorney, Agent, or Firm* — Amerson Law Firm, PLLC (57) ABSTRACT

A semiconductor structure includes a substrate and a resistor provided over the substrate. The resistor includes a first material layer, a second material layer, a first contact structure and a second contact structure. The first material layer includes at least one of a metal and a metal compound. The second material layer includes a semiconductor material. The second material layer is provided over the first material layer and includes a first sub-layer and a second sub-layer. The second sub-layer is provided over the first sub-layer. The first sub-layer and the second sub-layer are differently doped. Each of the first contact structure and the second contact structure provides an electrical connection to the second sub-layer of the second material layer.

27 Claims, 6 Drawing Sheets

SEMICONDUCTOR DEVICE INCLUDING A RESISTOR AND METHOD FOR THE FORMATION THEREOF

CROSS-REFERENCE TO RELATED APPLICATION

This is a divisional of co-pending application Ser. No. 14/173,995, filed Feb. 6, 2014, which claimed benefit of provisional application Ser. No. 61/792,348, filed Mar. 15, 2013.

BACKGROUND OF THE INVENTION

1. Field of the Invention

Generally, the present disclosure relates to the field of integrated circuits, and, in particular, to integrated circuits including resistors.

2. Description of the Related Art

Integrated circuits typically include a large number of circuit elements, which form an electric circuit. In addition to active devices such as, for example, field effect transistors and/or bipolar transistors, integrated circuits may include passive devices such as capacitors, inductivities and/or resistors.

Types of resistors that may be provided in integrated circuits include resistors that are formed from a layer of material that is deposited on a surface of a substrate, for example, on a surface of a region of the substrate wherein an electrically insulating material is provided. The region of the substrate including the electrically insulating material may include, for example, a trench isolation structure including, for example, silicon dioxide that is provided in a trench formed in a semiconductor wafer or die.

For reducing the number of material layers that must be deposited and/or patterned in the formation of an integrated circuit, it has been proposed to use material layers that are deposited over a semiconductor structure for forming gate electrodes of field effect transistors also for forming resistors. Conventionally, gate electrodes of field effect transistors have been formed of polysilicon. A polysilicon layer deposited on a substrate may be used for forming resistors over portions of a substrate, for example, over trench isolation structures provided adjacent active regions of field effect transistors. Over the active regions of the field effect transistors, gate electrodes may be formed from the polysilicon layer.

A resistance of a resistor formed from a polysilicon layer may depend on a sheet resistance of the polysilicon layer. The sheet resistance of the polysilicon layer may be controlled by doping the polysilicon layer, which may, for example, be performed by implanting ions of a dopant such as, for example, boron into the polysilicon layer.

For improving the performance of integrated circuits, it has been proposed to employ high-k metal gate (HKMG) technology for the formation of field effect transistors in integrated circuits. According to the high-k metal gate technology, silicon dioxide, which has been conventionally employed as a gate insulating material in field effect transistors, is replaced by a high-k material having a greater dielectric constant than silicon dioxide, for example, hafnium dioxide or hafnium silicon oxynitride. Using a gate insulation layer including a high-k material may help to increase the gate capacitance while, at the same time, avoiding leakage currents through the gate insulation layer.

Above the gate insulation layer including a high-k material, a gate electrode is provided. The gate electrode may include a first material layer and a second material layer. The first material layer is provided closer to the gate insulation layer than the second material layer, and may include a metal and/or a metal compound. The second material layer may include polysilicon. Providing the first layer including a metal and/or a metal compound between the high-k material of the gate insulation layer and the polysilicon of the second material layer may help to provide a work function of the gate electrode that is suitable for a field effect transistor including a gate insulation layer including a high-k material.

However, using first and second material layers that are provided for forming gate electrodes of field effect transistors in integrated circuits wherein the high-k metal gate technology is employed also for the formation of resistors may have issues associated therewith, as will be explained in the following.

For forming a resistor, contact structures may be provided at a surface of the second material layer including polysilicon that is opposite to an interface between the second material layer and the first material layer. The metal and/or metal compound of the first material layer may reduce the sheet resistance of the resistor, and may limit the highest obtainable sheet resistance value, even if the polysilicon layer is only weakly doped or substantially undoped, since there may be a path for an electric current between the contact structures through the first material layer.

It has been proposed to address the above-mentioned issue by removing portions of the first material layer in areas wherein resistors are to be formed before the deposition of the second material layer. However, this may increase the cost of the manufacturing process, increase the number of photolithography processes and, accordingly, the number of photolithography masks required, and may reduce the yield of the manufacturing process.

The present disclosure provides devices and methods wherein the above-mentioned issues may be avoided or at least reduced.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

An illustrative semiconductor structure disclosed herein includes a substrate and a resistor. The resistor is provided over the substrate and includes a first material layer, a second material layer, a first contact structure and a second contact structure. The first material layer includes at least one of a metal and a metal compound. The second material layer includes a semiconductor material and is provided over the first material layer. The second material layer includes a first sub-layer and a second sub-layer provided over the first sub-layer, wherein the first sub-layer and the second sub-layer are differently doped. Each of the first contact structure and the second contact structure provides an electrical connection to the second sub-layer of the second material layer.

An illustrative method disclosed herein includes forming a first material layer over a substrate. The first material layer includes at least of one a metal and a metal compound. A second material layer is formed over the first material layer. The second material layer includes a semiconductor material. Ions of fluorine are implanted into the second material layer. Ions of a first dopant are implanted into the second material layer. Ions of a second dopant are implanted into a second sub-layer of the second material layer. The second material layer has a first sub-layer that is closer to the substrate than the second sub-layer of the second material layer. The first dopant and the second dopant are of opposite conductivity type. After the implantation of the ions of fluorine, the ions of the first dopant and the ions of the second dopant, an annealing process activating the first and the second dopant is performed.

Another illustrative method disclosed herein includes providing a substrate. The substrate includes a first region and a second region. The first region of the substrate includes a first semiconductor material provided at a surface of the first region of the substrate. A layer of a gate insulation material is formed over at least the first region of the substrate. After the formation of the layer of the gate insulation material, a first material layer is formed over the first and the second region of the substrate. The first material layer includes at least one of a metal and a metal compound. After the formation of the first material layer, a second material layer is formed over the first and the second region of the substrate. The second material layer includes a second semiconductor material. The first material layer and the second material layer are patterned, wherein a gate electrode over the first region of the substrate and a resistor element over the second region of the substrate are formed from the first material layer and the second material layer. The gate electrode includes a first region of the second material layer. The resistor element includes a second region of the second material layer. Ions of fluorine are implanted into at least the second region of the second material layer. Ions of one or more dopants are implanted into the second region of the second material layer. The implantation of the ions of the one or more dopants into the second region of the second material layer forms a first sub-layer of the second material layer and a second sub-layer of the second material layer in the second region of the second material layer. The first and the second sub-layers are differently doped. After the implantation of the ions of fluorine and the ions of the one or more dopants, an annealing process is performed. The annealing process activates the one or more dopants.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

The present disclosure provides techniques wherein electrical insulation between a polysilicon layer formed over one or more metal layers and the one or more metal layers is provided by creating a sub-layer that is differently doped than the rest of the polysilicon layer at the bottom of the polysilicon layer. In particular, the sub-layer at the bottom of the polysilicon layer may be doped oppositely to the rest of the polysilicon layer. In some embodiments, the sub-layer at the bottom of the polysilicon layer may be N-doped, and the rest of the polysilicon layer may be P-doped. For providing the differently doped sub-layer, a dopant, for example, an N-type dopant such as arsenic, may be implanted into a portion of the polysilicon layer close to the one or more metal layers. Additionally, a dopant of the opposite type, for example, a P-type dopant such as boron, may be implanted into the rest of the polysilicon layer and/or into a portion of the polysilicon layer other than the sub-layer at the bottom of the polysilicon layer. Moreover, fluorine may be implanted into the polysilicon layer. Fluorine can moderate a thermally enhanced diffusion of other elements, for example dopants such as arsenic and/or boron. The presence of fluorine in the polysilicon layer may help to substantially avoid or at least reduce a diffusion of dopants, which may help to provide a layered structure wherein the polysilicon layer includes differently doped sub-layers.

Providing differently doped sub-layers of the polysilicon layer may help to substantially eliminate or at least reduce limitations of the sheet resistance imposed by the one or more metal layers, and may enable resistors having a relatively high sheet resistance in semiconductor structures wherein high-k metal gate technologies are employed. Other dopants than those mentioned above may also be used. Experiments performed by the inventor have shown that, using the above-mentioned techniques, sheet resistances of more than 800 ohm per square can be obtained, whereas resistors formed on the basis of polysilicon layers without differently doped sub-layers that are provided on top of one or more metal layers typically yield sheet resistivities of less than 800 ohm per square, even if the polysilicon layer is substantially undoped.

The present disclosure is not limited to embodiments wherein a sheet resistance of more than 800 ohm per square is obtained. For example, when a relatively thick metal layer is provided below the polysilicon, techniques according to the present disclosure may be employed for increasing the sheet resistance from about 400 ohm per square to about 600 ohm per square.

Figure 1:
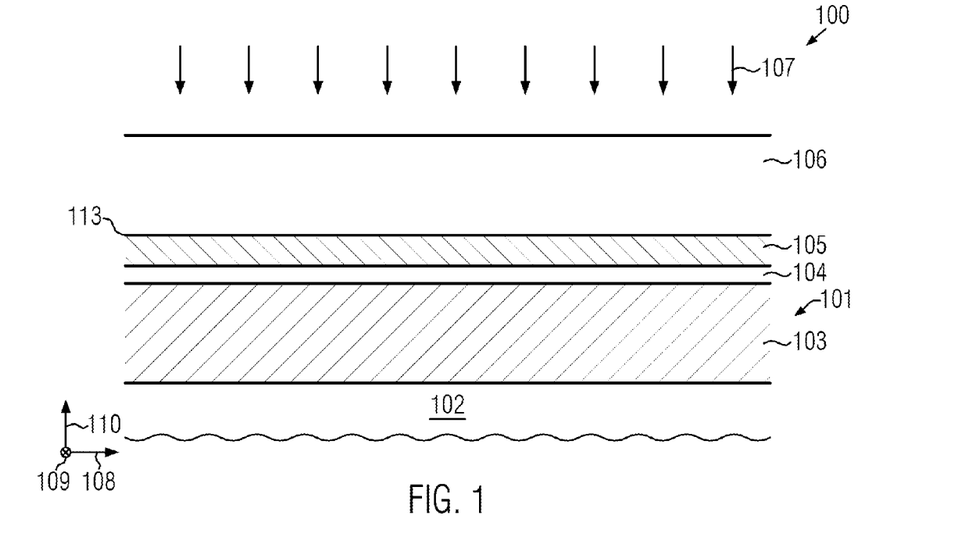
FIGS. 1-5 show schematic cross-sectional views of a semiconductor structure according to an embodiment in stages of a manufacturing process according to an embodiment.

FIG. 1 shows a schematic cross-sectional view of a portion of semiconductor structure 100 in a stage of a manufacturing process according to an embodiment. The semiconductor structure 100 includes a substrate 101. The substrate 101 may include a semiconductor portion 102 and an electrically insulating portion 103. The electrically insulating portion 103 of the substrate 101 may include an electrically insulating material, for example, silicon dioxide. The semiconductor portion 102 of the substrate 101 may include a wafer or die of a semiconductor material, for example, silicon. The electrically insulating portion 103 of the substrate 101 may include an isolation structure, for example, a shallow trench isolation structure formed in a trench provided in the semiconductor portion 102 of the substrate 101.

In some embodiments, the substrate 101 may be formed on the basis of a bulk semiconductor wafer, for example, a silicon wafer. In the wafer, trenches may be formed using techniques of photolithography and etching, and the trenches may be filled with an electrically insulating material to form the electrically insulating portion 103 of the substrate 101. For this purpose, techniques of oxidation and/or deposition may be employed.

The electrically insulating portion 103 of the substrate 101 need not be provided directly on the semiconductor portion 102, as shown in FIG. 1. In other embodiments, the substrate 101 may be formed on the basis of a semiconductor-on-insulator wafer including a layer of a semiconductor material, for example silicon, that is provided above a support wafer, which may also be formed of a semiconductor material, for example silicon, and separated therefrom by a layer of an electrically insulating material, for example silicon dioxide. In such embodiments, a trench may be formed in the layer of semiconductor material of the semiconductor-on-insulator wafer. The trench may extend through the layer of semiconductor material so that the layer of electrically insulating material of the semiconductor-on-insulator wafer is exposed at the bottom of the trench. The electrically insulating portion 103 may be formed by filling the trench with an electrically insulating material such as silicon dioxide. Thus, the electrically insulating portion 103 of the substrate 101 may be separated from the support wafer, being a semiconductor portion of the substrate 101, by the layer of electrically insulating material of the semiconductor-on-insulator wafer.

In FIG. 1, reference numeral 110 denotes a thickness direction of the substrate 101 (vertical in the plane of drawing of FIG. 1). Reference numerals 108, 109 denote horizontal directions of the substrate 101. In the plane of drawing of FIG. 1, the horizontal direction 108 extends horizontally. The horizontal direction 109 is perpendicular to the plane of drawing, and points away from the viewer, as indicated by a circle with an 'X' at its center.

The substrate 101 may have a disk-shape, wherein a dimension of the substrate 101 in the thickness direction 110 is smaller than a dimension of the substrate 101 in the horizontal direction 108 and a dimension of the substrate 101 in the horizontal direction 109. Moreover, the dimension of the substrate 101 in the thickness direction 110 may be smaller than any dimension of the substrate 101 in any other horizontal direction lying in a horizontal plane spanned by the horizontal directions 108, 109.

After the formation of the substrate 101, the electrically insulating portion 103 of the substrate 101 may be exposed at the surface of the substrate 101. The electrically insulating portion 103 of the substrate 101 may have a substantially horizontal surface that is substantially perpendicular to the horizontal direction 109 and has a surface normal substantially parallel to the thickness direction 110.

The semiconductor structure 100 may further include a layer 104 of a gate insulation material. The layer 104 of gate insulation material may include a dielectric material having a greater dielectric constant than silicon dioxide, for example, a dielectric constant greater than about 4. In some embodiments, the layer 104 of gate insulation material may include one or more materials selected from the group of materials including silicon nitride ($Si_3N_4$), aluminum oxide ($Al_2O_3$), hafnium oxide ($HfO_2$), zirconium oxide ($ZrO_2$), tantalum pentoxide ($Ta_2O_5$), hafnium silicon oxynitride (HfSiON) and/or zirconium silicon oxynitride (ZrSiON). In some embodiments, the layer 104 of gate insulation material may include a plurality of sub-layers formed of different materials from the above-mentioned group of materials. One or more sub-layers of other materials, for example of silicon dioxide, may also be provided.

The layer 104 of gate insulation material may be formed by performing one or more processes of chemical vapor deposition, plasma enhanced chemical vapor deposition and/or atomic layer deposition. The deposition process used for forming the layer 104 of gate insulation material may provide a substantially uniform thickness of the layer 104 of gate insulation material. Thus, after the deposition of the layer 104 of gate insulation material, the layer 104 of gate insulation material may have a substantially horizontal surface that is substantially parallel to the horizontal directions 108, 109 and perpendicular to the thickness direction 110, a surface normal of the layer 104 of gate insulation material being substantially parallel to the thickness direction 110. Further features of the layer 104 of gate insulation material may correspond to those of high-k gate insulation layers employed in high-k metal gate technologies.

The semiconductor structure 100 may further include a first material layer 105. The first material layer 105 may include a metal and/or a metal compound. In some embodiments, the first material layer 105 may include one or more materials selected from the group of materials including lanthanum (La), lanthanum nitride (LaN), titanium nitride (TiN), aluminum (Al) and/or aluminum nitride (AlN). In some embodiments, the first material layer 105 may include a plurality of sub-layers formed of different materials, for example, different materials selected from the above-mentioned group of materials.

The semiconductor structure 100 may further include a second material layer 106. The second material layer 106 may include a semiconductor material. The semiconductor material may be amorphous, or it may have a polycrystalline structure. In some embodiments, the second material layer 106 may include amorphous silicon and/or polysilicon.

The first material layer 105 and the second material layer 106 may have a substantially uniform thickness, at least in the portion of the semiconductor structure 100 shown in FIG. 1 wherein a resistor will be formed, as explained in more detail below. Thus, an interface 113 between the first material layer 105 and the second material layer 106 may be substantially parallel to the horizontal directions 108, 109 and may be substantially perpendicular to the thickness direction 110 of the substrate 101.

The first material layer 105 may have a thickness in a range from about 1.5-5 nm, for example a thickness of about 2.5 nm. The second material layer 106 may have a thickness in a range from about 35-65 nm, for example a thickness of about 55 nm.

The first material layer 105 may be formed by deposition processes for depositing one or more metals and/or metal compounds. For example, the first material layer 105 may be formed by processes of sputtering, chemical vapor deposition and/or plasma enhanced chemical vapor deposition. In embodiments wherein the first material layer 105 includes a plurality of sub-layers formed of different materials, the first material layer 105 may be formed by means of a sequence of deposition processes.

The second material layer 106 may be formed by a deposition process for depositing a semiconductor material, for example, a chemical vapor deposition process or a plasma enhanced chemical vapor deposition process.

Further features of the first material layer 105 and the second material layer 106 may correspond to features of layers of metals, metal compounds and/or semiconductors employed in high-k metal gate technologies.

The layer 104 of a gate insulation material, the first material layer 105 and the second material layer 106 may be provided in the form of a substantially contiguous layer stack extending across substantially the entire surface of the semiconductor structure 100.

In other embodiments, the layer 104 of gate insulation material, the first material layer 105 and the second material layer 106 may be provided over regions of the substrate 101, whereas no gate insulation layer 104, no first material layer 105 and/or no second material layer 106 is provided over other regions of the substrate 101. In such embodiments, a contiguous layer stack including the layer 104 of gate insulation material, the first material layer 105 and the second material layer 106 may be formed over the substrate 101. Thereafter, the layer stack may be patterned, for example, by means of techniques of photolithography and etching. In the patterning process, portions of the layer stack over one or more regions of the substrate 101 (not shown in FIG. 1) may be removed.

An ion implantation process may be performed, as schematically indicated by arrows 107 in FIG. 1. In the ion implantation process 107, the semiconductor structure 100 may be irradiated with ions of a first dopant. The first dopant, when incorporated into the semiconductor material of the second material layer 106, may create charge carriers. The first dopant may include an N-type dopant such as, for example, arsenic (As), which, when included into the semiconductor material of the second material layer 106, can create electrons. In other embodiments, the first dopant may be a P-type dopant such as, for example, boron (B), that creates holes when included into the semiconductor material of the second material layer 106.

In some embodiments, in the ion implantation process 107, ions of arsenic may be implanted into the second material layer 106. The ions may have an energy in a range from about 10-90 keV, for example an energy of about 70 keV, and a dose of the ions may be in a range from about $1 \times 10^{15}$ ions/cm$^2$ to about $8 \times 10^{15}$ ions/cm$^2$. In some embodiments, the ion dose may be about $2 \times 10^{15}$ ions/cm$^2$.

In the ion implantation process 107, ions may penetrate the second material layer 106, and may interact with atoms of the second material layer 106. Due to the interaction between the ions and the atoms of the second material layer 106, the ions may lose energy, and, finally, come to rest within the second material layer 106. The distance the ions travel through the second material layer 106 before they come to rest may depend on the type of ions used in the ion implantation process 107, the material of the second material layer 106 and the energy of the ions.

The number of interactions with atoms of the second material layer 106, and the loss of energy in each interaction between the ion and an atom of the second material layer 106 may have a certain degree of randomness, so that ions impinging on the semiconductor structure 100 at substantially the same energy and from approximately the same direction will come to rest at different distances from the surface of the second material layer 106. Thus, in the ion implantation process 107, a depth distribution of the first dopant in the second material layer 106 may be obtained.

The depth distribution may have a maximum, corresponding to a distance from the surface of the second material layer 106 at which most of the ions irradiated to the semiconductor structure 100 in the ion implantation process 107 come to rest. In the following, the distance between the maximum of the depth distribution of the ions of the first dopant obtained in the ion implantation process 107 and the surface of the second material layer 106, measured in the thickness direction 110 of the substrate 101, will be denoted as implantation depth of the ions of the first dopant.

The implantation depth of the ions of the first dopant may be smaller than the thickness of the second material layer 106, so that the maximum concentration of the first dopant is obtained at a distance from the interface between the first material layer 105 and the second material layer 106. Alternatively, the implantation depth of the first dopant may be approximately equal to the thickness of the second material layer 106, so that the maximum concentration of the first dopant is obtained at the interface 113 between the first material layer 105 and the second material layer 106. The value of the maximum concentration depends on the ion dose applied in the ion implantation process 107.

Figure 2:
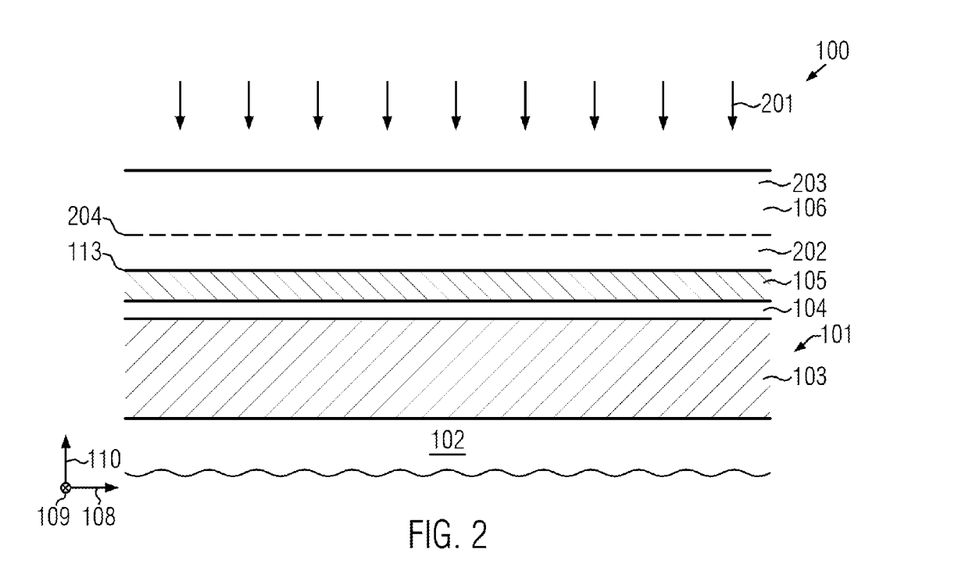

FIG. 2 shows a schematic cross-sectional view of the semiconductor structure 100 in another stage of the manufacturing process. An ion implantation process may be performed, as schematically indicated by arrows 201 in FIG. 2. In the ion implantation process 201, the semiconductor structure 100 may be irradiated with ions of a second dopant.

The second dopant, when incorporated into the semiconductor material of the second material layer 106, may create charge carriers of the opposite type than the charge carriers created by the first dopant that is implanted in the ion implantation process 107. In embodiments wherein ions of an N-type dopant are implanted into the second material layer 106 in the ion implantation process 107, ions of a P-type dopant may be implanted into the second material layer 106 in the ion implantation process 201. In embodiments wherein a P-type dopant is implanted into the second material layer 106 in the ion implantation process 107, ions of an N-type dopant may be implanted into the second material layer 106 in the ion implantation process 201.

In some embodiments, in the ion implantation process 201, the semiconductor structure 100 may be irradiated with ions of boron. The ions may have an energy in a range from about 2-10 keV, for example, an energy of about 4 keV. A dose of ions provided in the ion implantation process 107 may be in a range from about $1\times10^{15}$ ions/cm$^2$ to about $8\times10^{15}$ ions/cm$^2$. In some embodiments, ion doses of about $2.5\times10^{15}$ ions/cm$^2$ or about $4\times10^{15}$ ions/cm$^2$ may be applied.

Similar to the ions of the first dopant implanted into the second material layer 106 in the ion implantation process 107, the ions of the second dopant implanted into the second material layer 106 in the ion implantation process 201 may come to rest in the second material layer 106, so that a depth profile of the second dopant is provided in the second material layer 106. The depth profile of the second dopant may have a maximum, corresponding to an implantation depth of the second dopant.

The implantation depth of the second dopant obtained in the ion implantation process 201 may be smaller than the implantation depth of the first dopant obtained in the ion implantation process 107. Thus, the maximum of the depth distribution of the second dopant in the second material layer 106 may be closer to the surface of the second material layer 106 than the maximum of the depth distribution of the first dopant.

After the ion implantation processes 107, 201, the second material layer 106 may include a first sub-layer 202 and a second sub-layer 203. The first sub-layer 202 is closer to the substrate 101 and the interface 113 between the first material layer 105 and the second material layer 106 than the second sub-layer 203.

In the first sub-layer 202, a density of charge carriers of the type created by the first dopant that was implanted into the second material layer 106 in the ion implantation process 107 may be greater than a density of charge carriers of the type created by the second dopant that was implanted into the second material layer 106 in the ion implantation process 201. Therefore, the first sub-layer 202 may have a first doping of a first conductivity type, corresponding to the type of charge carriers provided by the first dopant.

In the second sub-layer 203, a density of charge carriers of the type created by the second dopant may be greater than a density of charge carriers of the type created by the first dopant. Thus, the second sub-layer 203 may have a second doping of a second conductivity type, corresponding to the type of charge carriers provided by the second dopant.

In embodiments wherein the first dopant includes arsenic and the second dopant includes boron, the first sub-layer 202 of the second material layer 106 may be N-doped, and the second sub-layer 203 of the second material layer 106 may be P-doped. In other embodiments, the first sub-layer 202 may be P-doped, and the second sub-layer 203 may be N-doped.

Between the sub-layers 202, 203 of the second material layer 106, which have a doping of opposite conductivity type, a PN transition can be obtained. In FIG. 2, reference numeral 204 denotes a plane of the PN transition between the first sub-layer 202 and the second sub-layer 203. The plane 204 of the PN transition may be substantially perpendicular to the thickness direction 110 of the substrate 101, and substantially parallel to the horizontal directions 108, 109. Hence, the second sub-layer 203 of the second material layer 106 is located over the first sub-layer 202, i.e., at a greater distance to the substrate 101 than the first sub-layer 202.

The present disclosure is not limited to a particular relationship between the implantation depth of the ions of the first dopant and the thickness of the second material layer. In some embodiments, in particular in embodiments wherein the first dopant includes arsenic, in the ion implantation process 107, the ions of the first dopant may be implanted into the second material layer such that a relatively small concentration of the first dopant is obtained at the interface between the first material layer 105 and the second material layer 106.

For example, the implantation depth of the ions of the first dopant may be approximately equal to about one half of the thickness of the second material layer 106, so that the maximum concentration of the first dopant is obtained approximately at the center of the second material layer 106. In still further embodiments, the implantation depth of the first dopant may be smaller than about one half of the thickness of the second material layer 106, so that the maximum concentration of the first dopant is obtained in the upper half of the second material layer 106.

In such embodiments, a layered arrangement of a first sub-layer 202 and a second sub-layer 203 having a different conductivity type need not be present directly after the ion implantation processes 107, 201. Instead, a redistribution of the first dopant and the second dopant may occur during an annealing process, wherein the first dopant and the second dopant are activated. Such an annealing process will be described in more detail below.

Depending on parameters of the annealing process, such as duration and temperature, the first dopant, in particular when being arsenic, may be distributed over the second material layer 106, whereas the second dopant, in particular when being boron, may diffuse to a lesser extent, in particular in the presence of fluorine, as will be detailed below. After the annealing process, a layered arrangement of sub-layers 202, 203 of the second material layer 106 having a different conductivity type as described above may be obtained.

Figure 3:
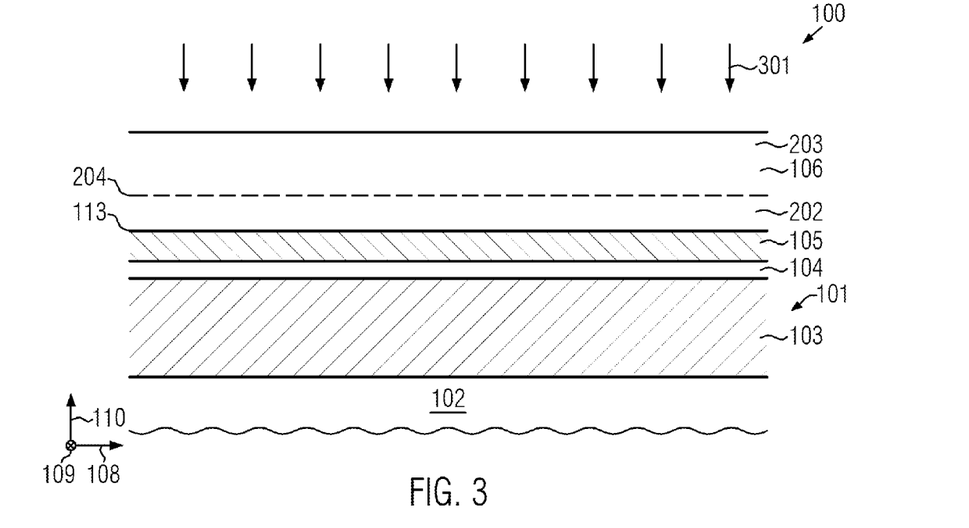

FIG. 3 shows a schematic cross-sectional view of the semiconductor structure 100 in another stage of the manufacturing process. In addition to the ion implantation processes 107, 201, an ion implantation process 301 may be performed. In the ion implantation process 301, the semiconductor structure 100 may be irradiated with ions of fluorine, so that fluorine is incorporated into the second material layer 106.

The presence of fluorine in the semiconductor material of the second material layer 106, which may, as detailed above, include polysilicon or amorphous silicon, may moderate the diffusion of other elements in the second material layer 106. In particular, the presence of fluorine in the semiconductor material of the second material layer 106 may reduce diffusion coefficients of the first dopant and the second dopant in the semiconductor material of the second material layer 106. For example, the presence of fluorine in amorphous silicon or polysilicon may reduce the diffusion coefficients of boron and arsenic.

Similar to the ion implantation processes 107, 201, the ion implantation process 301 may provide a depth distribution of fluorine in the second material layer 106. The depth distribution of fluorine in the second material layer 106 may have a maximum, corresponding to an implantation depth of the fluorine. The implantation depth of the fluorine may depend on the energy of the fluorine ions implanted in the ion implantation process 301, and on the type of semiconductor material of the second material layer 106.

In some embodiments, the ion implantation process 301 may be adapted such that the implantation depth of the ions of fluorine obtained in the ion implantation process 301 is smaller than the implantation depth of the ions of the first dopant in the ion implantation process 107 and greater than the implantation depth of ions of the second dopant in the ion implantation process 201.

Thus, a particularly high concentration of fluorine may be obtained in the vicinity of the plane 204 of the PN transition between the sub-layers 202, 203 of the second material layer 106. This may help to prevent a diffusion of the first dopant from the first sub-layer 202 into the second sub-layer 203, and a diffusion of the second dopant from the second sub-layer 203 into the first sub-layer 202 of the second material layer 106, in particular during an annealing process that will be described in more detail below. Thus, the presence of fluorine may help to maintain the presence of the differently doped sub-layers 202, 203 of the second material layer 106 during one or more annealing processes.

In further embodiments, the implantation depth of fluorine may be approximately equal to the implantation depth of the second dopant, in particular in embodiments wherein the second dopant includes boron. Thus, a particularly high concentration of fluorine may be obtained at locations wherein there is a relatively high concentration of the second dopant, which may also be helpful for reducing the diffusion of the second dopant.

In some embodiments, the ions of fluorine irradiated to the semiconductor structure 100 in the ion implantation process 301 may have an energy in a range from about 10-40 keV, for example, an energy of about 30 keV. A dose of the ions of fluorine may be in a range from about $1 \times 10^{15}$ ions/cm$^2$ to about $4 \times 10^{15}$ ions/cm$^2$. In particular, the dose of the ions of fluorine may be about $1.5 \times 10^{15}$ ions/cm$^2$ or about $2.5 \times 10^{15}$ ions/cm$^2$.

The present disclosure is not limited to embodiments wherein the ion implantation processes 107, 201, 301 are performed in the order described above. In other embodiments, the ion implantation processes 107, 201, 301 may be performed in a different order. For example, the ion implantation process 201 wherein the second dopant is implanted into the second material layer 106 may be performed before the ion implantation process 107 wherein the first dopant is implanted into the second material layer 106. Moreover, the ion implantation process 301 wherein fluorine is implanted into the second material layer 106 need not be performed after the ion implantation processes 107, 201. In other embodiments, the ion implantation process 301 may be performed before the first one of the ion implantation processes 107, 201, or the ion implantation process 301 may be performed between the ion implantation processes 107, 201.

Moreover, in some embodiments, manufacturing processes other than the ion implantation processes 107, 201, 301 may be performed between a pair of subsequent ones of the ion implantation processes 107, 201, 301. The other manufacturing processes may, in particular, include manufacturing processes for patterning the first material layer 105, the second material layer 106 and/or the layer 104 of gate insulation material, for example, processes of photolithography and etching. In the patterning of the layers 104, 105, 106, portions of the layers 104, 105, 106 in parts of the semiconductor structure 100 other than the part shown in FIGS. 1 to 3 may be removed.

In some embodiments, the ion implantation process 301 wherein fluorine is implanted into the second material layer 106 may be performed before the patterning process, so that the fluorine is implanted into a substantially contiguous second material layer 106 extending across substantially the entire surface of the semiconductor structure 100. Thereafter, the layers 104, 105, 106 may be patterned, and the ion implantation processes 107, 201 may be performed after the patterning. Alternatively, each of the ion implantation processes 107, 201, 301 may be performed before or after the patterning process.

Figure 4:
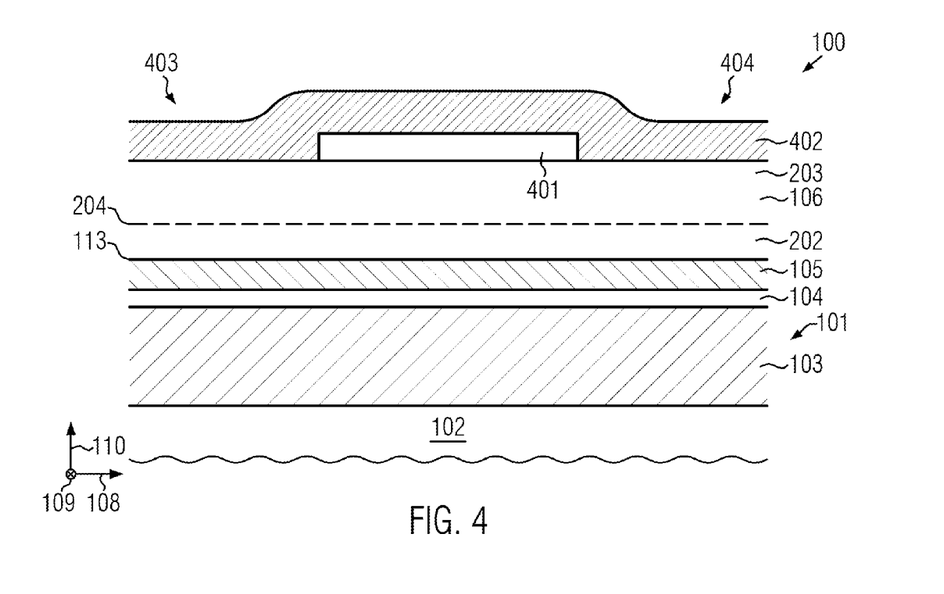

FIG. 4 shows a schematic cross-sectional view of the semiconductor structure 100 in another stage of the manufacturing process. After the ion implantation processes 107, 201, 301, a silicide block mask 401 may be formed over the second material layer 106. The silicide block mask 401 may be a hard mask, and may be formed of an electrically insulating material such as, for example, silicon dioxide, silicon oxynitride and/or silicon nitride. The silicide block mask 401 may cover a region of the semiconductor structure 100 as shown in FIG. 4, wherein a resistor 508 (see FIG. 5) is to be formed, with the exception of a first end 403 and a second end 404, wherein contact structures 506, 507 (see FIG. 5) providing an electrical connection to the second sub-layer 203 of the second material layer 106 are to be formed.

The silicide block mask 401, when being a hard mask, may be formed by depositing a layer of a material of the silicide block mask 401, for example a layer of a dielectric material such as silicon dioxide, silicon oxynitride and/or silicon nitride. This may be done by means of a chemical vapor deposition process or a plasma enhanced chemical vapor deposition process. Thereafter, the layer of the material of the silicide block mask 401 may be patterned. In the patterning, portions of the layer of the material of the silicide block mask 401 over the ends 403, 404 may be removed, so that the second sub-layer 203 of the second material layer 106 is exposed at the ends 403, 404. The patterning of the layer of the material of the silicide block mask 401 may be performed by means of techniques of photolithography and etching.

After the formation of the silicide block mask 401, a layer 402 of a refractory metal, for example a layer of nickel, tungsten and/or platinum, may be deposited over the semiconductor structure 100. This may be done, for example, by means of a sputtering process.

Figure 5:
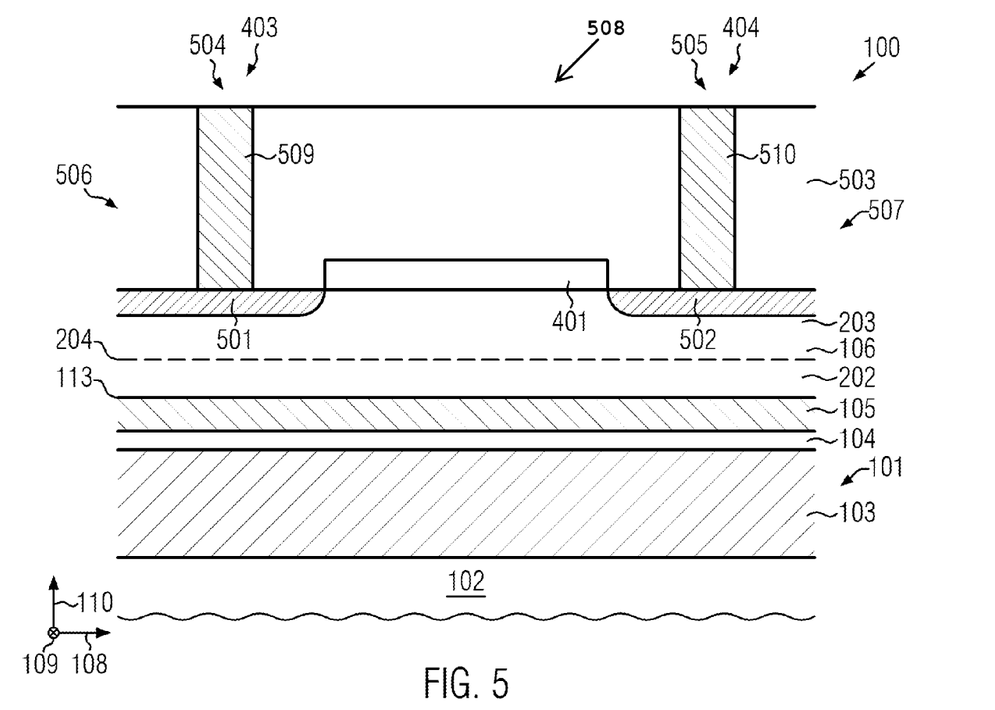

FIG. 5 shows a schematic cross-sectional view of the semiconductor structure 100 in a later stage of the manufacturing process. After the deposition of the layer 402 of refractory metal, an annealing process may be performed. The annealing process may be a thermal annealing process, for example, a rapid thermal annealing process.

In the annealing process, portions of the layer 402 of refractory metal at the ends 403, 404 may react with the semiconductor material of the second sub-layer 203 of the second material layer 106. In the chemical reaction, a silicide may be formed. Thus, a silicide region 501 may be created at the end 403, and a silicide region 502 may be created at the end 404. In a portion of the second material layer 106 between the ends 403, 404, the silicide block mask 401 may prevent a contact between the refractory metal of the layer 402 and the semiconductor material of the second material layer 106. Thus, a formation of silicide below the silicide block mask 401 may be substantially avoided, so that the silicide regions 401, 402 are separated from each other by a portion of the second material layer 106 wherein no silicide is formed.

In the annealing process, the first dopant and the second dopant that were implanted into the second material layer 106 may be activated. Due to the presence of fluorine in the second material layer 106, in particular in the vicinity of the plane 204 of the PN transition between the sub-layers 202, 203 of the second material layer 106, a diffusion of dopants between the sub-layers 202, 203 may be reduced or substantially avoided. Thus, the presence of fluorine in the second material layer 106 may help to avoid that the first dopant and the second dopant diffuse all across the second material layer 106. Thus, the layered structure of the second material layer 106, including sub-layers 202, 203 including dopants of opposite conductivity type, may be maintained after the annealing process.

After the annealing process, a cleaning process may be performed to remove portions of the layer 402 of refractory metal that have not reacted with the semiconductor material of the second sub-layer 203 of the second material layer 106. In particular, in the cleaning process, portions of the layer 402 of refractory metal over the silicide block mask 401 may be removed.

Thereafter, a layer 503 of electrically insulating material may be deposited over the semiconductor structure 100. The layer 503 of electrically insulating material may include silicon dioxide, silicon oxynitride and/or silicon nitride, and may be deposited by means of a chemical vapor deposition process or a plasma enhanced chemical vapor deposition process.

Contact vias 504, 505 may be formed in the layer 503 of electrically insulating material. This may be done by means of known techniques of photolithography and etching.

After the formation of the contact vias 504, 505, a metal plug 509 may be formed in the contact via 504, and a metal plug 510 may be formed in the contact via 505. This may be done by depositing a layer of a metal, for example tungsten, over the semiconductor structure 100, for example by means of a chemical vapor deposition process. Thereafter, a chemical mechanical polishing process may be performed. The chemical mechanical polishing process may remove portions of the metal layer outside the contact vias 504, 505, and may provide a substantially planar surface of the layer 503 of electrically insulating material.

The metal plug 509 in the contact via 504 and the silicide region 501 provide a first contact structure 506 providing an electrical connection to the second sub-layer 203 of the second material layer 106 at the first end 403. The metal plug 510 in the contact via 505 and the silicide region 502 provide a second contact structure 507 providing an electrical connection to the second sub-layer 203 of the second material layer 106 at the second end 404. A current may flow between the contact structures 506, 507 through the second sub-layer 203 of the second material layer 106 if a voltage is applied to the contact structures 506, 507.

The contact structures 506, 507 and a portion of the second material layer 106 between the contact structures 506, 507 may form a resistor 508.

Due to the PN transition between the oppositely doped sub-layers 202, 203 of the second material layer 106, a current flow through the first material layer 105 which, as detailed above, may include one or more metals, may be avoided or at least reduced. Thus, a resistance of the resistor 508 may be substantially provided by the second sub-layer 203 of the second material layer 106, which may be formed of a semiconductor material, such as amorphous silicon or polysilicon.

In addition to depending on dimensions of the resistor 508, such as a distance between the contact structures 506, 507 provided at the ends 403, 404 of the resistor 508, and a width of the resistor 508, being a an extension of the resistor 508 in the horizontal direction 109 that is perpendicular to the plane of drawing of FIGS. 1-5, the resistance of the resistor 508 may depend on a sheet resistance of the resistor 508. The sheet resistance may be measured by means of well-known techniques, for example by means of a Kelvin probe, wherein electrical contact is made to the second sub-layer 203 of the second material layer 106.

Figure 6:
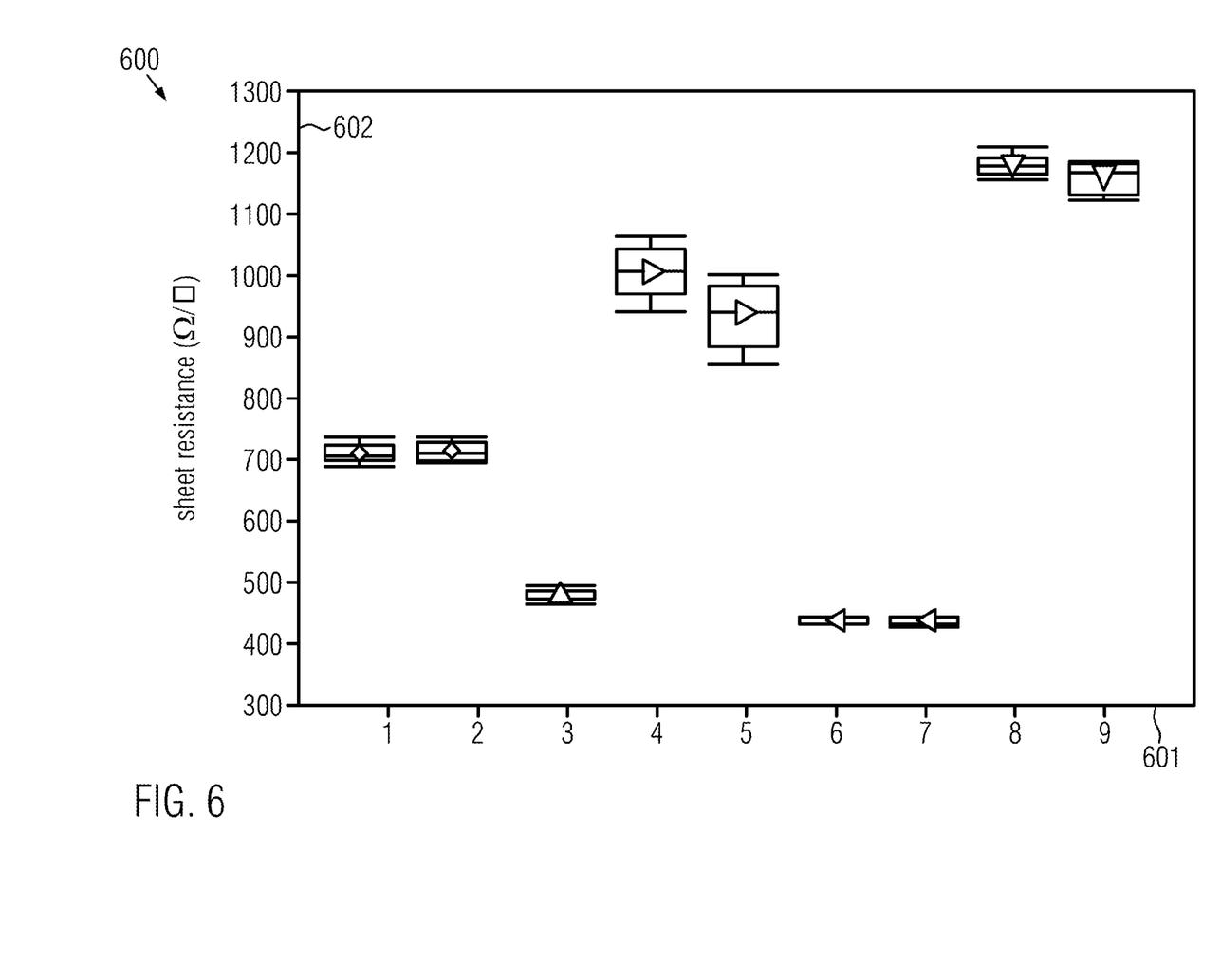
FIG. 6 shows a diagram illustrating results of measurements of a sheet resistance.

FIG. 6 shows schematic results of measurements of a sheet resistance performed at a semiconductor structure including a first material layer 105, and a second material layer 106. FIG. 6 shows a schematic diagram 600 including a horizontal coordinate axis 601 and a vertical coordinate axis 602. The horizontal coordinate axis 601 denotes wafer numbers, and the vertical coordinate axis 602 denotes sheet resistance.

Wafers 1 and 2 are comparison examples, wherein a dose of boron of $1.8 \times 10^{14}$ ions/cm$^2$ was implanted into a second material layer similar to the second material layer 106 by means of an ion implantation process similar to the ion implantation process 107 at an ion energy of 6 keV. The second material layer included polysilicon and was formed above a first material layer including a metal. No implantation of a second dopant and no implantation of fluorine were performed. As shown in FIG. 6, a sheet resistance of about 700 ohm per square may be obtained in such configurations.

For wafers 3 to 9, differently doped sub-layers 202, 203 of the second material layer have been formed, using techniques as described above with reference to FIGS. 1-5. In particular, implantations of ions of dopants providing opposite conductivity type, as well as an implantation of fluorine, were performed. Ion energies and ion doses are shown in the following table. Arsenic has been implanted into the first sub-layer 202, and boron was implanted into the second sub-layer 203.

| Wafer No. | B energy (keV) | B dose ($10^{15}$/cm$^2$) | As energy (keV) | As dose ($10^{15}$/cm$^2$) | F energy (keV) | F dose ($10^{15}$/cm$^2$) |
|---|---|---|---|---|---|---|
| 3 | 3 | 2.5 | 70 | 0.5 | 40 | 1.5 |
| 4 & 5 | 3 | 2.5 | 70 | 2 | 40 | 1.5 |
| 6 & 7 | 3 | 4 | 70 | 0.5 | 40 | 1.5 |
| 8 & 9 | 3 | 4 | 70 | 2 | 40 | 1.5 |

As can be seen in FIG. 6, for wafers 3, 6 and 7, wherein only small amounts of arsenic were implanted, relatively low sheet resistances of less than 500 ohm per square were obtained. For wafers 4, 5, 8 and 9, wherein higher doses of arsenic were provided, which were sufficient to provide opposite conductivity types of the sub-layers 202, 203, greater sheet resistances of more than 800 ohm per square were obtained.

Figure 8:
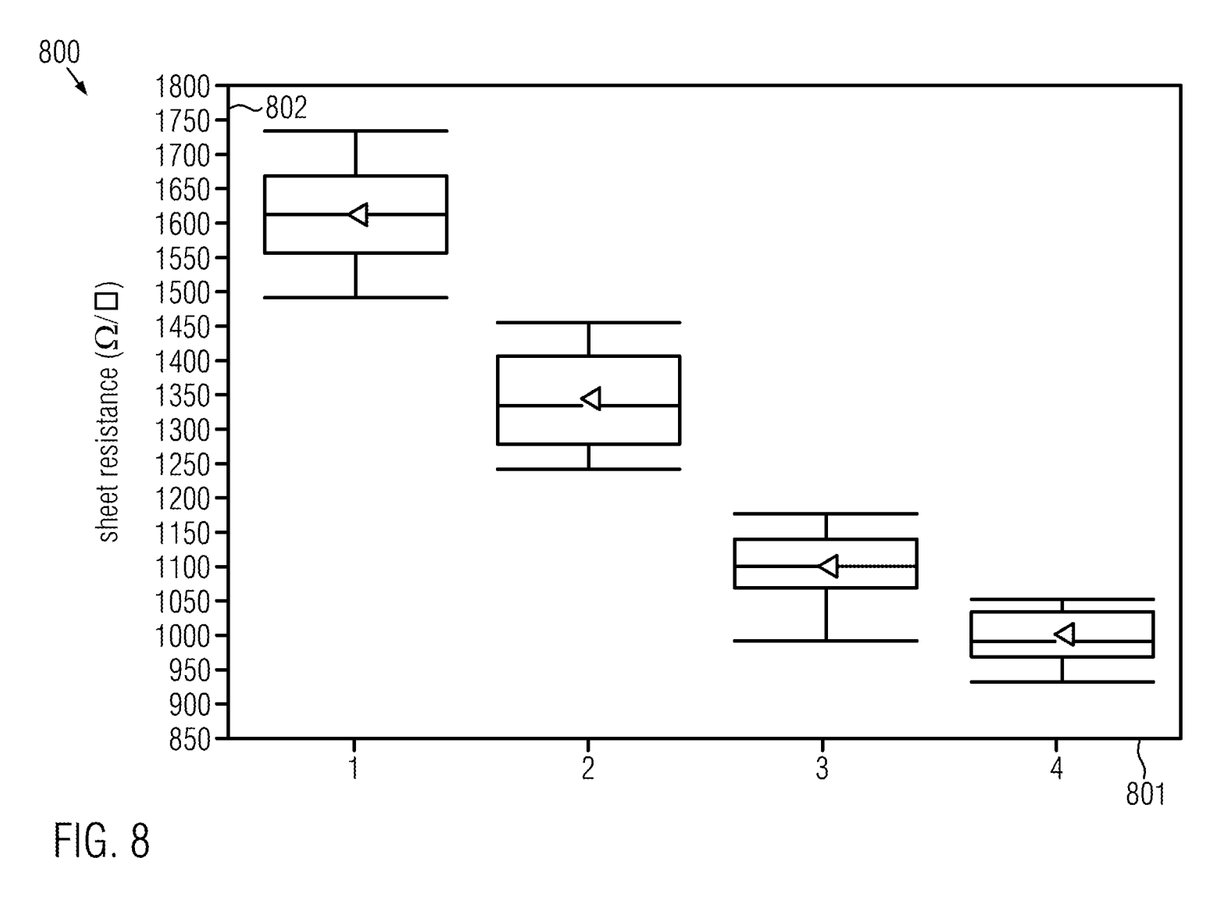
FIG. 8 shows a diagram illustrating results of measurements of a sheet resistance.

Further results of measurements will be described with reference to FIG. 8. FIG. 8 shows schematic results of measurements of a sheet resistance performed at a semiconductor structure including a first material layer 105 and a second material layer 106. FIG. 8 shows a schematic diagram 800 including a horizontal coordinate axis 801 and a vertical coordinate axis 802. The horizontal coordinate axis 801 denotes wafer numbers, and the vertical coordinate axis 802 denotes sheet resistance.

In all the examples shown in FIG. 8, ions of arsenic having an ion energy of 70 keV were implanted. The ion dose of arsenic was $2 \times 10^{15}$ ions/cm$^2$. Additionally, in all the examples shown in FIG. 8, ions of fluorine were implanted at an ion energy of 40 keV. The dose of the fluorine ions was $1.5 \times 10^{15}$ ions/cm$^2$.

Additionally, ions of boron were implanted. The ion energy of the boron ions was 4 keV, and different doses of boron ions were applied. For wafer 1, the ion dose of the boron ions was $2.4 \times 10^{15}$ ions/cm$^2$. For wafer 2, the ion dose of the boron ions was $2.8 \times 10^{15}$ ions/cm$^2$. For wafer 3, the ion dose of the boron ions was $3.2 \times 10^{15}$ ions/cm$^2$. For wafer 4, the ion dose of the boron ions was $3.6 \times 10^{15}$ ions/cm$^2$. The ion implantation angle was 0 degrees.

As can be seen from FIG. 8, depending on the dose of the boron ions, sheet resistivities in a range from about 900 ohm per square to about 1750 ohm per square were obtained, wherein the sheet resistivity decreases with increasing dose of the boron ions.

An embodiment will be described with respect to FIG. 7. For convenience, in FIGS. 1-5, on the one hand, and FIG. 7, on the other hand, like reference numerals have been used to denote like components. Features of components shown in FIG. 7 may correspond to features of components shown in FIGS. 1-5 denoted by like reference numerals, and corresponding methods may be used for their formation.

Figure 7:
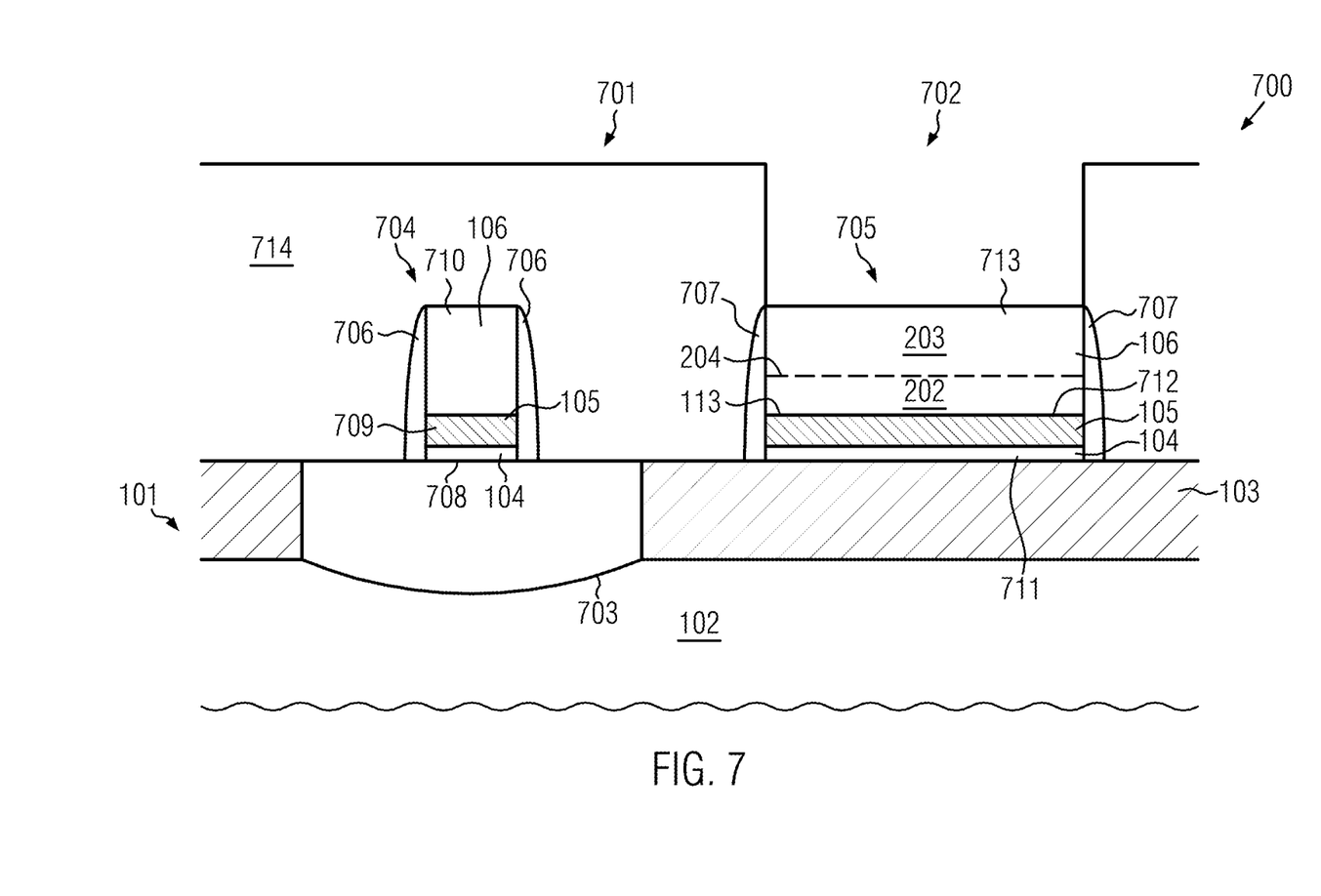
FIG. 7 shows a schematic cross-sectional view of a semiconductor structure according to an embodiment in a stage of a manufacturing process according to an embodiment.

FIG. 7 shows a schematic cross-sectional view of a semiconductor structure 700 in a stage of a manufacturing process. The semiconductor structure 700 includes a substrate 101. The substrate 101 includes a semiconductor portion 102 and an electrically insulating portion 103, which may be provided in the form of a trench isolation structure formed in a trench provided in the semiconductor portion 102.

The substrate 101 includes a first region 701, where a field effect transistor will be formed, and a second region 702, where a resistor will be formed.

In the first region 701 of the substrate 101, the semiconductor portion 102 of the substrate 101 may be provided at the surface of the substrate 101. In the second region 702 of the substrate 101, the electrically insulating material of the electrically insulating portion 103 of the substrate 101 may be provided at the surface of the substrate 101.

The first region 701 of the substrate 101 may include an active region 703 of a field effect transistor. The electrically insulating portion 103 of the substrate 101 may provide electrical insulation between the active region 703 and other circuit elements of the semiconductor structure 700. In particular, the electrically insulating portion 103 of the substrate 101 may provide electrical insulation between the active region 703 and a resistor that will be formed over the second region 702 of the substrate, as will be described in the following.

The semiconductor structure 700 further includes a gate electrode 704 formed over the first region 701 of the substrate 101 and a resistor element 705 formed over the second region 702 of the substrate 701. The resistor element 705 may provide a substantial portion of the resistivity of the resistor that will be formed over the second region 702 of the substrate 701. A sidewall spacer 706 may be provided adjacent the gate electrode 704, and a sidewall spacer 707 may be provided adjacent the resistor element 705.

The gate electrode 704 may include a first region 709 of a first material layer 105, which may include one or more metals and/or metal compounds. Additionally, the gate electrode 704 may include a first region 710 of a second material layer 106, which may include a semiconductor material. The gate electrode 704 may be separated from the active region 703 by a first region 708 of a layer 104 of a gate insulation material which may include a high-k dielectric material.

The resistor element 705 may include a second region 712 of the first material layer 105 and a second region 713 of the second material layer 106. Between the electrically insulating portion 103 of the substrate 101 and the second region 712 of the first material layer 105, a second region 711 of the layer 104 of gate insulation material may be provided.

In the second region 713 of the second material layer 106, the second material layer 106 includes a first sub-layer 202 and a second sub-layer 203. The first sub-layer 202 may have a first doping of a first conductivity type. The sub-layer 203 may have a second doping of a second conductivity type. The first doping of the first sub-layer 202 and the second doping of the second sub-layer 203 may be of opposite conductivity type, so that there is a PN transition between the first sub-layer 202 and the second sub-layer 203. Reference numeral 204 denotes a plane of the PN transition between the first sub-layer 202 and the second sub-layer 203, which may be substantially perpendicular to a thickness direction of the substrate 101 and a surface normal of the electrically insulating portion 103 of the substrate 101 on which the second portions 711, 712, 713 of the layers 104, 105, 106 are formed.

In FIG. 7, reference numeral 714 denotes a mask. The mask 714 covers the first region 701 of the substrate 101, and the first regions 708, 709, 710 of the layers 104, 105, 106. However, the mask 714 does not cover the second regions 711, 712, 713 of the layers 104, 105, 106.

The semiconductor structure 700 may be formed as follows. The electrically insulating portion 103 may be formed by forming a trench in the semiconductor portion 102 of the substrate 101, and filling the trench with an electrically insulating material, as described above with reference to FIG. 1. Thereafter, an ion implantation process, wherein the semiconductor structure 700 is irradiated with ions of a dopant, may be performed for forming the active region 703 in the semiconductor portion 102 of the substrate 101.

Thereafter, the layer 104 of gate insulation material, the first material layer 105 and the second material layer 106 may be formed by means of deposition processes as described above with reference to FIG. 1, wherein the layers 104, 105, 106 may be deposited over substantially the entire surface of the semiconductor structure 700.

After the formation of the layers 104, 105, 106, a patterning process may be performed. In the patterning process, portions of the layers 104, 105, 106 other than the first regions 708, 709, 710 and the second regions 711, 712, 713 may be removed. This may be done by means of techniques of photolithography and etching. In the patterning process, the gate electrode 704 and the resistor element 705 are formed.

Thereafter, the sidewall spacers 706, 707 may be formed. This may be done by substantially isotropically depositing a layer of a spacer material, for example silicon dioxide and/or silicon nitride, over the semiconductor structure 700. Thereafter, an anisotropic etch process may be performed for removing portions of the layer of spacer material over substantially horizontal portions of the semiconductor structure 700. Due to the anisotropy of the etch process, portions of the layer of spacer material at the sidewalls of the gate electrode 704 and the resistor element 705 have a smaller etch rate, and may remain in the semiconductor structure 700, forming the sidewall spacers 706, 707. Then, the mask 714 may be formed by means of a photolithography process.

After the formation of the mask 714, ion implantation processes similar to ion implantation processes 107, 201 described above with reference to FIGS. 1 and 2 may be performed for forming the differently doped sub-layers 202, 203 in the second region 713 of the second material layer 106. Additionally, an ion implantation process similar to the ion implantation process 301 described above with reference to FIG. 3, may be performed for implanting fluorine into the second region 713 of the second material layer 106.

Since the gate electrode 704 and the active region 703 are covered by the mask 714, an implantation of ions into the active region 703 and the gate electrode 704 during the above-described ion implantation processes may be avoided.

Thus, a layered arrangement of differently doped sub-layers 202, 203 may be selectively provided in the second region 713 of the second material layer 106, whereas the first region 710 of the second material layer 106 does not include differently doped sub-layers.

The ion implantation process for implanting ions of fluorine described above need not be performed after the patterning of the layers 104, 105, 106 and the formation of the mask 714. In other embodiments, the implantation of ions of fluorine into the second material layer 106 may be performed before the patterning process and before the formation of the mask 714, so that fluorine is implanted into substantially the entire second material layer 106.

After the formation of the sub-layers 202, 203 in the second region 713 of the second material layer 106, the mask 714 may be removed. Thereafter, another mask may be formed over the semiconductor structure 700, which covers the resistor element 705, but not the active region 703 and the gate electrode 704. Then, ion implantation processes may be performed for forming source and drain regions (not shown) adjacent the gate electrode 704, and for introducing dopants into the gate electrode 704. This may be done in accordance with known techniques for forming field effect transistors.

Thereafter, contact structures may be formed, as described above with reference to FIGS. 4 and 5, wherein one or more annealing processes activating dopants in the semiconductor structure 700 may also be performed.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A resistor, comprising:
   a first material layer comprising at least one of a metal and a metal compound, said first material layer positioned above a substrate;
   a second material layer comprising a semiconductor material, said second material layer positioned above said first material layer, said second material layer comprising a first doped sub-layer and a second doped sub-layer positioned above said first doped sub-layer, wherein said first doped sub-layer is doped with a dopant of a first conductivity type and said second doped sub-layer is doped with a dopant of a second conductivity type, said second conductivity type being opposite to said first conductivity type; and
   a first contact structure and a second contact structure, each of said first contact structure and said second contact structure providing an electrical connection to said second doped sub-layer of said second material layer.

2. The resistor of claim 1, wherein said substrate has a thickness direction, wherein a dimension of said substrate in said thickness direction is less than any dimension of said substrate in any horizontal direction that is perpendicular to said thickness direction, and wherein said first and said second doped sub-layers of said second material layer define a plane of a PN transition between said first and said second doped sub-layer of said second material layer, said plane of said PN transition being substantially perpendicular to said thickness direction.

3. The resistor of claim 2, wherein said first material layer and said second material layer define an interface between said first material layer and said second material layer, said interface being substantially perpendicular to said thickness direction.

4. The resistor of claim 3, wherein said first contact structure is positioned at a first end of said resistor and said second contact structure is positioned at a second end of said resistor, said first and said second ends of said resistor being spaced apart along a longitudinal direction of said resistor that is substantially perpendicular to said thickness direction.

5. The resistor of claim 1, wherein said semiconductor material comprises polysilicon.

6. The resistor of claim 5, wherein said first doped sub-layer of said second material layer is doped with arsenic and said second doped sub-layer of said second material layer is doped with boron.

7. The resistor of claim 6, wherein said second material layer further comprises a fluorine implant region.

8. The resistor of claim 7, wherein a location of maximum concentration of fluorine in said fluorine implant region is positioned adjacent an interface between said first and said second doped sub-layers of said second material layer.

9. The resistor of claim 8, wherein said resistor has a sheet resistance of more than about 800 ohm per square.

10. The resistor of claim 1, wherein said first doped sub-layer of said second material layer is doped with boron and said second doped sub-layer of said second material layer is doped with arsenic.

11. A resistor, comprising:
    a first material layer comprising at least one of a metal and a metal compound, said first material layer positioned above a substrate;
    a second material layer comprising polysilicon or amorphous silicon, said second material layer positioned above said first material layer, said second material layer comprising:
      a first doped sub-layer that is doped with a dopant of a first conductivity type;
      a second doped sub-layer positioned above said first doped sub-layer, wherein said second doped sub-layer is doped with a dopant of a second conductivity type, said second conductivity type being opposite to said first conductivity type; and
      a fluorine implant region; and
    a first contact structure and a second contact structure, each of said first contact structure and said second contact structure providing an electrical connection to said second doped sub-layer of said second material layer.

12. The resistor of claim 11, wherein said first and said second doped sub-layers of said second material layer define a plane of a PN transition between said first and said second doped sub-layer of said second material layer, said plane of said PN transition being substantially parallel to an upper surface of said substrate.

13. The resistor of claim 12, wherein said first material layer and said second material layer define an interface between said first material layer and said second material layer, said interface being substantially parallel to said upper surface of said substrate.

14. The resistor of claim 13, wherein said first contact structure is provided at a first end of said resistor and said second contact structure is provided at a second end of said resistor, said first and said second ends of said resistor being spaced apart along a longitudinal direction of said resistor that is substantially parallel to said upper surface of said substrate.

15. The resistor of claim 11, wherein said first doped sub-layer of said second material layer is doped with arsenic and said second doped sub-layer of said second material layer is doped with boron.

16. The resistor of claim 11, wherein said first doped sub-layer of said second material layer is doped with boron and said second doped sub-layer of said second material layer is doped with arsenic.

17. The resistor of claim 11, wherein a location of maximum concentration of fluorine in said fluorine implant region is positioned adjacent an interface between said first and said second doped sub-layers of said second material layer.

18. A resistor positioned above a substrate, comprising:
a first material layer comprising at least one of a metal and a metal compound;
a second material layer comprising polysilicon or amorphous silicon, said second material layer positioned on and in contact with said first material layer, said second material layer comprising:
a first doped sub-layer that is doped with a dopant of a first conductivity type;
a second doped sub-layer positioned above said first doped sub-layer, wherein said second doped sub-layer is doped with a dopant of a second conductivity type, said second conductivity type being opposite to said first conductivity type, and wherein said first and said second doped sub-layers define a plane of a PN transition between said first and said second doped sub-layers that is substantially parallel to an upper surface of said substrate; and
a fluorine implant region, wherein a location of maximum concentration of fluorine in said fluorine implant region is positioned adjacent said plane of said PN transition; and
a first contact structure and a second contact structure, each of said first contact structure and said second contact structure providing an electrical connection to said second doped sub-layer of said second material layer.

19. The resistor of claim 18, wherein said first material layer and said second material layer define an interface that is substantially parallel to said upper surface of said substrate.

20. The resistor of claim 1, wherein said resistor is positioned on an upper surface of an isolation structure formed in a semiconductor layer of said substrate.

21. The resistor of claim 1, wherein said resistor is laterally spaced apart and electrically isolated from a transistor element formed in and above an active region that is formed in a semiconductor layer of said substrate.

22. The resistor of claim 1, wherein said resistor further comprises a layer of gate insulation material positioned between said first material layer and said substrate.

23. The resistor of claim 22, wherein said layer of gate insulation material comprises a high-k dielectric material.

24. The resistor of claim 1, wherein said second material layer is positioned on and in contact with an upper surface of said first material layer.

25. The resistor of claim 11, wherein said resistor is positioned on an upper surface of an isolation structure formed in a semiconductor layer of said substrate.

26. The resistor of claim 11, wherein said resistor further comprises a layer of gate insulation material positioned between said first material layer and said substrate.

27. The resistor of claim 11, wherein said second material layer is positioned on and in contact with an upper surface of said first material layer.

* * * * *